(12) United States Patent
Ceintrey et al.

(10) Patent No.: US 7,968,005 B2
(45) Date of Patent: Jun. 28, 2011

(54) WHITE LIGHT EMITTING DIODE

(75) Inventors: Claude Ceintrey, Marly-le-Roi (FR);
Thierry Le-Mercier, Paris (FR);
Etienne Wortham, Meaux (FR)

(73) Assignee: Rhodia Chimie, Aubervilliers (FR)

( * ) Notice: Subject to any disclaimer, the term of this patent is extended or adjusted under 35 U.S.C. 154(b) by 296 days.

(21) Appl. No.: 11/547,154

(22) PCT Filed: Apr. 6, 2005

(86) PCT No.: PCT/FR2005/000841
§ 371 (c)(1),
(2), (4) Date: May 14, 2007

(87) PCT Pub. No.: WO2005/112135
PCT Pub. Date: Nov. 24, 2005

(65) Prior Publication Data
US 2008/0035888 A1 Feb. 14, 2008

(30) Foreign Application Priority Data
Apr. 16, 2004 (FR) .................................. 04 04045

(51) Int. Cl.
*H01L 33/00* (2010.01)
*C09K 11/59* (2006.01)
(52) U.S. Cl. ................. 252/301.4 F; 313/503; 313/487; 257/98
(58) Field of Classification Search ............ 252/301.4 F; 313/503, 487; 257/98
See application file for complete search history.

(56) References Cited

U.S. PATENT DOCUMENTS

| | | | | |
|---|---|---|---|---|
| 3,544,482 A | * | 12/1970 | Barry | 252/301.4 R |
| 6,809,347 B2 | * | 10/2004 | Tasch et al. | 257/103 |
| 7,026,755 B2 | * | 4/2006 | Setlur et al. | 313/501 |
| 2002/0038861 A1 | * | 4/2002 | Toda et al. | 252/301.4 F |
| 2002/0063301 A1 | | 5/2002 | Hanamoto et al. | |

FOREIGN PATENT DOCUMENTS

| | | |
|---|---|---|
| JP | 2001-118790 A | 4/2001 |
| JP | 2002-531955 A | 9/2002 |
| JP | 2003-110150 | 4/2003 |
| WO | WO 00/33389 A1 | 6/2000 |
| WO | WO 02/054502  * | 7/2002 |
| WO | WO 2005/004202 A2 | 1/2005 |

* cited by examiner

*Primary Examiner* — C. Melissa Koslow
(74) *Attorney, Agent, or Firm* — Buchanan Ingersoll & Rooney, P.C.

(57) ABSTRACT

The inventive white-light emitting diode is characterized in that it comprises a source emitting radiation whose wavelength band ranges from 370 to 420 nm, a first blue and red-light emitting phosphor of formula Ba3(1-x)Eu3xMg1-yMnySi2O8 (1), wherein 0 < x 0,3 and 0 < y 0,3 and a second green-light emitting phosphor. In another embodiment, said diode comprises the same source and a single phosphor whose chemical composition is Ba3(1-x)Eu3xMg1-yMnySi2O8, wherein 0 < x 0,3 et 0 < y 0,3 and which is embodied in the form of a mixture of at least Ba2SiO4, Ba2MgSi2O7 and Ba3MgSi2O8 phases. The inventive diode can be used for a lighting device.

10 Claims, 2 Drawing Sheets

WHITE LIGHT EMITTING DIODE

This application is an application under 35 U.S.C. Section 371 of International Application Number PCT/FR2005/000841 filed on Apr. 6, 2005.

The present invention relates to a light-emitting diode that emits white light.

Light-emitting diodes (LEDs) are products undergoing extensive development at the present time. Most particularly it is sought to obtain LEDs that emit white light. To do this, and to be able to have good color rendition, it is necessary to employ, in the manufacture of such LEDs, a combination of at least three phosphors, each emitting in a primary emission color. Now, it is desirable to use the fewest possible phosphors so as to make it easier to manufacture these LEDs and/or to improve their properties.

The present invention meets this requirement.

For this purpose, the light-emitting diode according to the invention, which emits white light, is characterized in that it comprises:
 a source of radiation emission in the wavelength range between 370 nm and 420 nm;
 a first phosphor that emits blue light and red light, of formula:

  (1)

in which $0<x\leq 0.3$ and $0<y\leq 0.3$; and
 a second phosphor that emits green light.

According to another embodiment of the invention, the diode emitting white light is characterized in that it comprises:
 a source of radiation emission in the wavelength range between 370 nm and 420 nm;
 a phosphor of the following chemical composition:

where $0<x\leq 0.3$ and $0<y\leq 0.3$;
this phosphor being in the form of a mixture of at least the phases $Ba_2SiO_4$, $Ba_2MgSi_2O_7$ and $Ba_3MgSi_2O_8$.

The LEDs according to the various embodiments of the invention have the advantage of comprising only a small number of phosphors.

Other features, details and advantages of the invention will become even more fully apparent from reading the following description and from the appended drawing in which.

Figure 1:
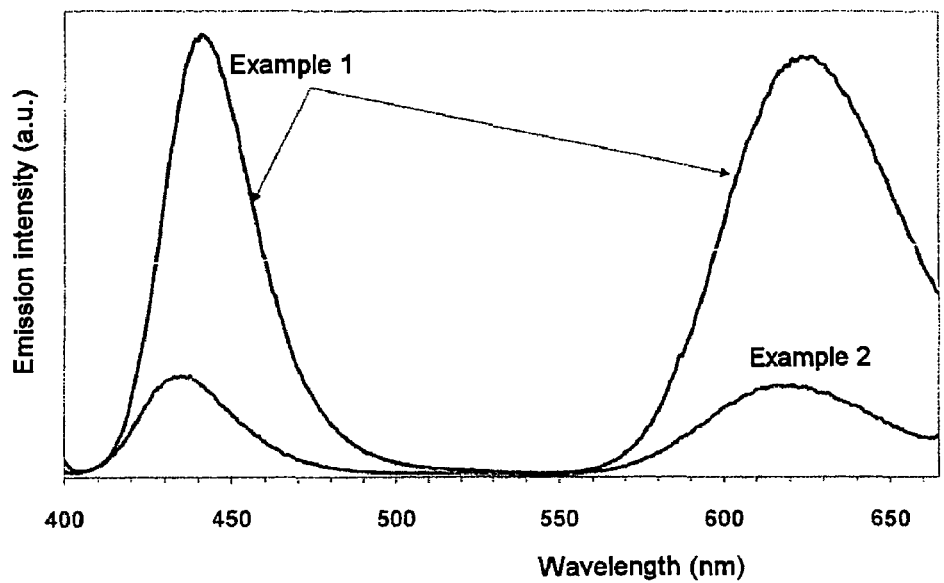
FIG. 1 is a graph showing the emission spectra of two phosphors according to the invention for an excitation wavelength of 370 nm.

The term "rare earths" is understood to mean the elements of the group formed by scandium, yttrium and the elements of the Periodic Table with atomic numbers lying between 57 and 71 inclusive.

It should be pointed out that, for the rest of the description, unless otherwise indicated, in the ranges of values given, the limit values are inclusive.

In the case of the first embodiment of the invention, the LED comprises three essential elements, which are an emission source and two phosphors.

More precisely, the emission source is a source capable of emitting radiation whose wavelength lies within the range from about 370 nm to about 420 nm. This is in fact radiation within the near-ultraviolet to visible range. Such sources are well known in the art—for example, they may be semiconductors of the InGaN, GaN or AlGaN type.

In a manner known per se, this source is provided with electrical connections in order to be connected to an electrical circuit. The radiation emitted by the source will serve to excite the phosphors of the LED of the invention.

In the case of the first embodiment, the LED comprises a first phosphor that is capable of emitting both blue light and red light. This phosphor satisfies formula (1) given above.

This phosphor is a barium/magnesium silicate doped with europium, which may be considered as a partial substitute for the barium, and with manganese, which may be considered as a partial substitute for the magnesium.

When it is subjected to UV excitation, that is to say radiation in a wavelength range between about 370 nm and about 420 nm, this product has the property of emitting particularly in the red, but also in the blue, that is to say in a wavelength range between 400 nm and 500 nm as regards blue light and between 550 nm and 720 nm, more particularly between 550 nm and 700 nm, as regards red light, with a good yield.

More particularly, the phosphor satisfies the aforementioned formula (1) in which $0.0001\leq x\leq 0.25$ and $0.0001\leq y\leq 0.25$.

Even more particularly, the phosphor satisfies the aforementioned formula (1) in which $0.01\leq x\leq 0.25$ and $0.01\leq y\leq 0.25$.

It may be noted that it is advantageous to have a europium concentration in the compound of at least 0.01% in order to obtain emission of higher intensity. It is also advantageous to have a europium concentration and a manganese concentration of at most 25% so as to minimize undesirable self-quenching effects. The percentages indicated above correspond to the molar degrees of substitution of the dopant ions $Eu^{2+}$ and $Mn^2$ for the $Ba^{2+}$ and $Mg^{2+}$ ions, respectively.

According to another variant, the phosphor of formula (1) satisfies the following x and y values: $0.01\leq x\leq 0.03$ and $0.04\leq y\leq 0.06$. For these values of x and y, the emission intensity is the highest.

According to yet another variant, the phosphor of formula (1) satisfies the following values of x and y: $0.01\leq x\leq 0.02$ and $0.05\leq y\leq 0.1$. In this case, the phosphors have, for each of the colors, blue and red, substantially identical emission intensities.

In a final variant, the phosphor of formula (1) satisfies the following values of x and y: $0.09\leq x\leq 0.11$ and $0.09\leq y\leq 0.11$. In this case, the phosphors have a high emission intensity in the red.

Finally, in the compound of formula (1), the barium, the magnesium and the silicon may be partially substituted with elements other than those described above. Thus, the barium may be partially substituted with calcium and/or strontium, in a proportion that may range up to about 30%, this proportion being expressed by the substituent/(substituent+barium) atomic ratio. The magnesium may be partially substituted with zinc, in a proportion that may range up to about 30%, this proportion also being expressed by the Zn/(Zn+Mg) atomic ratio. Finally, the silicon may be partially substituted with germanium, aluminum and/or phosphorus, in a proportion that may range up to about 10%, this proportion being expressed by the substituent/(substituent+silicon) atomic ratio.

Finally, this first phosphor is in the form of a pure phase. This is because the X-ray diagram of this product reveals only one phase, corresponding to the $Ba_3MgSi_2O_8$ phase.

According to the first embodiment, the second phosphor of the LED is a phosphor that emits green light. By this is meant light whose wavelength lies between about 500 nm and about 550 nm. This phosphor is capable of emitting this light when it is subjected to the radiation emitted by the aforementioned source.

Several known products exist that can be used as second phosphor of this type for the LED according to the invention.

Thus, this second phosphor may be chosen from the product families given below:

zinc sulfides (ZnS) doped with copper or doped with copper and aluminum;

alkaline-earth silicates doped with europium; by this is meant products of the $MSi_2O_5:Eu^{2+}$ or $M_2SiO_4:Eu^{2+}$ type, M being an alkaline-earth such as barium or strontium;

alkaline-earth aluminates doped with europium or europium in combination with manganese, such as products of the following type: $MAl_2O_4:Eu^{2+}$, M being an alkaline earth such as strontium; $M_4Al_{14}O_{25}:Eu^{2+}$, M being an alkaline earth such as strontium; or else of the following type: $M_{0.82}Al_{12}O_{18.82}:Eu^{2+}$ or $M_{0.82}Al_{12}O_{18.82}:(Eu^{2+}, Mn^{2+})$, M being an alkaline earth such as barium;

rare-earth borates doped with cerium and with terbium, such as for example products of formula $MBO_3:(Ce^{3+}, Tb^{3+})$, M being at least one rare earth such as Sc, Gd, Lu, optionally combined with yttrium;

zinc, magnesium or alkaline-earth thiogallates, thioaluminates or thioindates doped with europium and/or with manganese, or else doped with cerium and with terbium; in this case, they may be products of the dopant: $MN_2S_4$ type, M denoting at least zinc, magnesium or an alkaline earth, such as, for example Ca, Sr, Ba and N denoting at least Al, Ga and In;

alkaline-earth phosphates or borophosphates doped with europium or doped with europium and terbium; mention here may be made of products of formula $M_2P_2O_7:(Eu^{2+},Tb^{3+})$ or of formula $M_6BP_5O_{20}:Eu^{2+}$, in which formulae M is an alkaline earth, such as strontium for example;

rare-earth silicates doped with europium and terbium, such as products of formula $M_2SiO_5:(Ce^{3+},Tb^{3+})$, M being at least one rare earth such as Y, Gd and Lu;

yttrium nitrogen silicates doped with europium, such as $Y_5(SiO_4)_3N:Ce^{3+}$;

magnesium/rare-earth aluminates doped with europium in combination with cerium and terbium or in combination with manganese; mention may be made of products of the dopant: $MMgAl_{10}O_{17}$ type, M being at least one alkaline earth, for example a Ba, Sr combination; and magnesium/alkaline-earth chlorosilicates doped with europium, optionally in combination with manganese, especially a product of the dopant(s): $M_8Mg(SiO_4)Cl_2$ type, M being an alkaline earth, for example calcium.

In a manner known per se, the products mentioned as dopants in the products that have lust been mentioned above are used in combination with the matrix in order to give it the required luminescence properties.

As second preferred phosphor within the context of the present invention, it is possible to use $Ba_2SiO_4$ doped with europium, $SrGa_2S_4$ doped with europium, zinc sulfide doped with copper or doped with copper and aluminum, and $SrAl_2O_4$ doped with europium.

It is also possible to use as second phosphor a compound based on at least one element A, chosen from the alkaline earths, and on at least one element B, chosen from aluminum, gallium or indium, on sulfur, and on a dopant capable of giving said compound luminescence properties, which second phosphor is in the form of a mixture of predominant crystallographic phase of the $AB_2S_4$ type and a crystallographic phase of the $B_2S_3$ type. Such a compound is described in Patent Application WO 02/100976, the teaching of which the reader may refer to. The element B may more particularly be gallium and the element A strontium. The dopant may be chosen from divalent manganese, divalent rare earths and from the group comprising trivalent rare earths in combination with an alkali metal, it being possible for the dopant to be more particularly europium II or ytterbium in combination with an alkali metal.

The phosphor of formula (1) used for the invention is generally prepared by a solid-state reaction at high temperature.

The oxides of the required metals, or organic or mineral compounds capable of forming these oxides by heating, such as carbonates, oxalates, hydroxides, acetates, nitrates and borates of said metals, may be used directly as starting product.

An intimate mixture is formed, especially by milling, with the appropriate concentrations of all the starting products in the finely divided state.

It is also possible to envisage preparing a starting mixture by coprecipitation from solutions of the precursors of the desired oxides, for example in an aqueous medium.

The mixture of the starting products is then heated at least once for a period ranging between one hour and around 100 hours approximately, at a temperature lying between about 500° C. and about 1300° C. It is preferable to carry out the heating in the presence of a flux, for example of the $NH_4Cl$ type, and at least partly in a reducing atmosphere (for example hydrogen in argon) in order to bring the europium completely to the divalent state.

The second embodiment of the invention will now be described.

The difference with respect to the first embodiment is that the diode now comprises just one phosphor. This is a product that satisfies the chemical composition given above. This composition corresponds to formula (1) given above with the aforementioned values of x and y. All the more particular values of x and y that were mentioned above, and those mentioned for the possible partial substitutions of the barium, the magnesium and the silicon, also apply here in the case of this phosphor. However, unlike the phosphor of the first embodiment that is in the form of a pure phase, this one is in the form of a mixture of at least three phases. They are at least the $Ba_2SiO_4$, $Ba_2MgSi_2O_7$ and $Ba_3MgSi_2O_8$ phases. An additional phase of the $BaCO_3$ type may optionally be present. The existence of these phases is demonstrated by X-ray analysis and the resulting diagrams.

When it is subjected to UV excitation of the same type as indicated above (between about 370 nm and about 420 nm), this product emits in the red and in the blue, but also in the green (emission between 500 nm and 550 nm). As a result, in the case of this second embodiment, the LED of the invention that emits white light comprises, however, just one phosphor.

The phosphor of the second embodiment may also be prepared by a solid/solid reaction at high temperature from the oxides of the required metals or from organic or mineral compounds capable of forming these oxides by heating, such as carbonates, oxalates, hydroxides, acetates, nitrates and borates of said metals.

In this case, a homogeneous mixture is formed with the appropriate concentrations of all the starting products. This mixture is formed by simply deagglomerating the powders of the starting products, without milling them. Next, a calcination operation is carried out. This calcination may be carried out without a flux. It is preferably carried out, at least in part, in a reducing atmosphere (for example hydrogen in argon) for the reason given above, and at a temperature that is preferably about at least 500° C. and at most 1150° C.

In both the embodiments described, it is preferable to use phosphors having sizes of at most 20 μm and preferably at most 10 μm, the mean size of which may for example be between 3 μm and 6 μm. These size values are those determined by the laser diffraction technique and using a particle size analyser of the COULTER type (combined with a 450 W ultrasonic probe).

In both the embodiments described, and in a known manner for manufacturing an LED, the phosphor or phosphors are incorporated into a polymer matrix, for example of the epoxy type, into which the aforementioned source of radiation emission is inserted, the whole assembly being placed in a package.

In the case of the first embodiment, the colorimetry of the white light emitted by the LED depends on the nature of the two phosphors and on their respective proportions. As is known, these proportions may be defined by determining the relative quantum yields of each of the phosphors.

Finally, the invention relates to an illumination device characterized in that it comprises a diode of the type described above. Such devices, such as lamps, are well known and formed for example from one or more LEDs inserted in layers into packages, one surface of which is transparent.

Examples will now be given.

EXAMPLE 1

This example relates to a phosphor that can be used for the first embodiment of the invention, which satisfies the composition $Ba_3MgSi_2O_8:(2\% \; Eu^{2+}, 5\% \; Mn^{2+})$, and that corresponds to the formula $Ba_{2.94}Eu_{0.06}Mg_{0.95}Mn_{0.05}Si_2O_8$ (the indicated percentages of the dopant ions correspond to the molar degrees of substitution of the $Eu^{2+}$ and $Mn^{2+}$ ions for the $Ba^{2+}$ and $Mg^{2+}$ ions respectively). The process was started by solid-state mixing of the $BaCO_3$, $Eu_2O_3$, $(MgCO_3)_4Mg(OH)_2.5H_2O$, $MnCO_3$ and $SiO_2$ oxides in stoichiometric proportions. Added to the mixture as flux was 0.4 mol of $NH_4Cl$.

| Starting products | Quantities used |
|---|---|
| $BaCO_3$ | 1.8629 g |
| $Eu_2O_3$ | 0.0339 g |
| $(MgCO_3)_4Mg(OH)_2 \cdot 5H_2O$ | 0.2963 g |
| $MnCO_3$ | 0.0185 g |
| $SiO_2$ | 0.3858 g |
| $NH_4Cl$ | 0.0687 g |

These starting products were uniformly mixed by milling. The mixture, placed in a crucible, was put into a furnace where it underwent two heat treatments. A first heat treatment was carried out at 600° C. for 4 hours in air. The mixture, which was gray in color, was then milled and put back into the furnace, in an alumina crucible. After the furnace was purged for 4 hours with a 10% $Ar/H_2$ mixture, the mixture was heated for 4 hours at 1200° C. in this reducing atmosphere. The rate of temperature rise and the rate of temperature fall employed were both 360° C./h. The product obtained was in the form of a white powder.

EXAMPLE 2

This example relates to a phosphor that can be used for the first embodiment of the invention, satisfying the composition $(2\% \; Eu^{+2}, 20\% \; Mn^{2+}):Ba_3MgSi_2O_8$ and corresponding to the formula $Ba_{2.94}Eu_{0.06}Mg_{0.8}Mn_{0.2}Si_2O_8$. The process began, as in Example 1, by solid-state mixing of the $BaCO_3$, $Eu_2O_3$, $(MgCO_3)_4Mg(OH)_2.5H_2O$, $MnCO_3$ and $SiO_2$ oxides in stoichiometric proportions. Added to the mixture as flux was 0.4 mol of $NH_4Cl$.

| Starting products | Quantities used |
|---|---|
| $BaCO_3$ | 1.8629 g |
| $Eu_2O_3$ | 0.0339 g |
| $(MgCO_3)_4Mg(OH)_2 \cdot 5H_2O$ | 0.2492 g |
| $MnCO_3$ | 0.0740 g |
| $SiO_2$ | 0.3858 g |
| $NH_4Cl$ | 0.0687 g |

The operating mode was then identical to that of Example 1.

The curves in FIG. 1 give, for the compounds thus obtained, the emission spectrum for an excitation wavelength of 370 nm. It may therefore be seen that, in response to an excitation in the UV range, the compounds emit in the red (peak at around 625 nm) and also in the blue (peak at around 440 nm).

Figure 2:
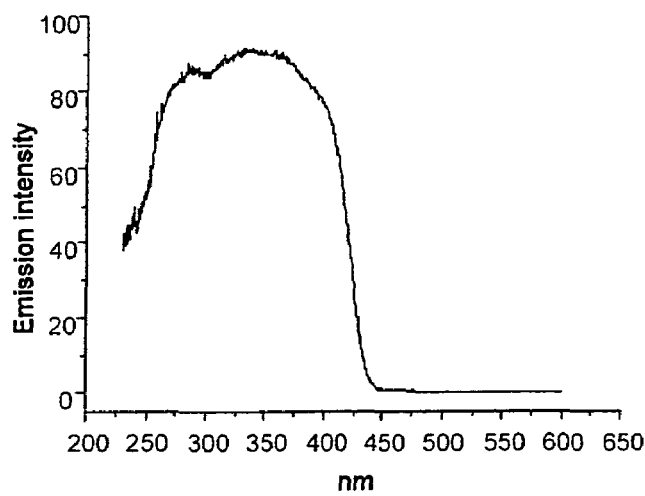
FIG. 2 is a graph showing the excitation spectrum of a phosphor according to the invention for an emission wavelength of 623 nm.

The excitation spectrum for the compound of Example 1, for the 623 nm emission wavelength, is shown in FIG. 2. It is apparent from this figure that the maximum yield is achieved for a wavelength of 350 nm. Between 350 nm and 400 nm, the relative yield varies between 100% and 78%.

EXAMPLE 3

A mixture was formed from a phosphor of Example 1 and the compound of formula $(Sr_{0.95}Eu_{0.05})Ga_{2.1}S_4$ obtained in the manner described in Example 1 of WO 02/100976, in various proportions by weight. Given below are the trichromatic coordinates of the mixtures obtained. These coordinates were calculated from the emission spectrum for the mixtures, according to the NF X 08-12 standard (x, y CIE 1931 system).

| | | |
|---|---|---|
| Phospor (Ex. 1) | 60% | 70% |
| $(Sr_{0.95}Eu_{0.05})Ga_{2.1}S_4$ | 40% | 30% |
| Trichromatic coordinates | x = 0.341 | x = 0.352 |
| | y = 0.374 | y = 0.325 |

EXAMPLE 4

This example relates to a phosphor that can be used for the second embodiment of the invention.

The compound prepared was identical to that of Example 1 as regards its formulation. The process started, as described in Example 1, with the same starting products and in the same quantities. However, these products were simply mixed and deagglomerated, without being milled.

Next, the calcination operation was carried out as in Example 1.

Figure 3:
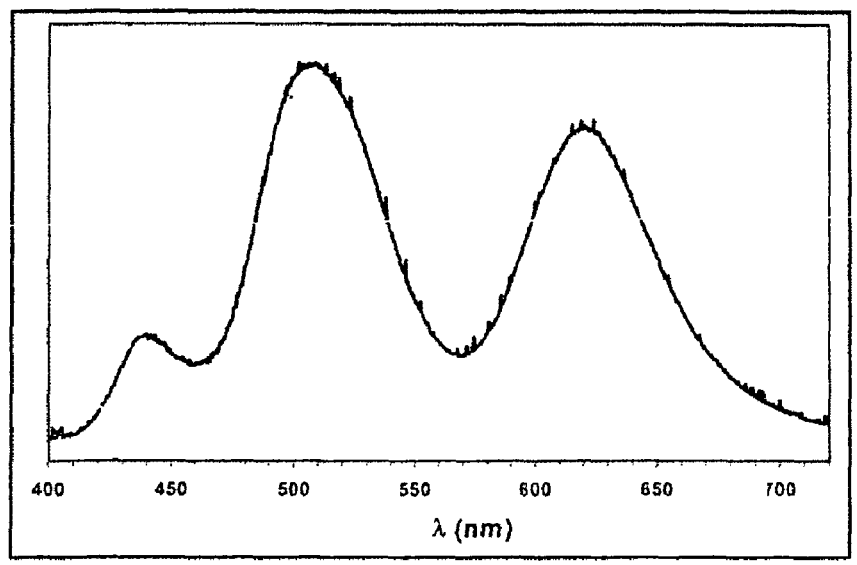
FIG. 3 is a graph showing the emission spectrum of a phosphor according to the invention for an excitation wavelength of 370 nm.

FIG. 3 gives, for the compounds thus obtained, the emission spectrum for an excitation wavelength of 370 nm. It may therefore be seen that, in response to an excitation in the UV range, the compound emits in the red (peak at around 625 nm), in the blue (peak at around 440 nm) and also in the green (peak at around 510 nm).

The trichromatic coordinates of the compound were calculated from the emission spectrum of FIG. 3 and according to the aforementioned standard. These coordinates are x=0.36 and y=0.4.

EXAMPLES 5 TO 7

These examples relate to phosphors that can be used for the first embodiment of the invention.

To prepare the products, the process started as in Example 1 by mixing the starting products and by milling for 30 minutes. A first heat treatment was carried out at 950° C. for 2 hours in air. The product resulting from the calcination operation was mixed over 30 minutes with 1% by weight of $NH_4Cl$. The mixture was then heated for 4 hours at 1200° C. in a reducing atmosphere consisting of an $Ar/H_2$ mixture containing 5% $H_2$. After the treatment, the product was lightly milled.

Table 1 below gives the quantities (in g) of the starting products used and Table 2 gives the formulae of the phosphors obtained.

TABLE 1

| Example | $BaCO_3$ | $Mg(OH)_2$, $4MgCO_3 \cdot 5H_2O$ | $SiO_2$ | $Eu_2O_3$ | $MnCO_3$ |
|---|---|---|---|---|---|
| 5 | 18.771 | 2.769 | 3.932 | 0.338 | 0.395 |
| 6 | 17.142 | 2.754 | 3.910 | 1.681 | 0.393 |
| 7 | 17.059 | 2.436 | 3.891 | 1.673 | 0.782 |

TABLE 2

| Example | |
|---|---|
| 5 | $Ba_{2.94}Eu_{0.06}Mg_{0.9}Mn_{0.1}Si_2O_8$ |
| 6 | $Ba_{2.70}Eu_{0.30}Mg_{0.9}Mn_{0.1}Si_2O_8$ |
| 7 | $Ba_{2.70}Eu_{0.30}Mg_{0.8}Mn_{0.2}Si_2O_8$ |

Figure 4:
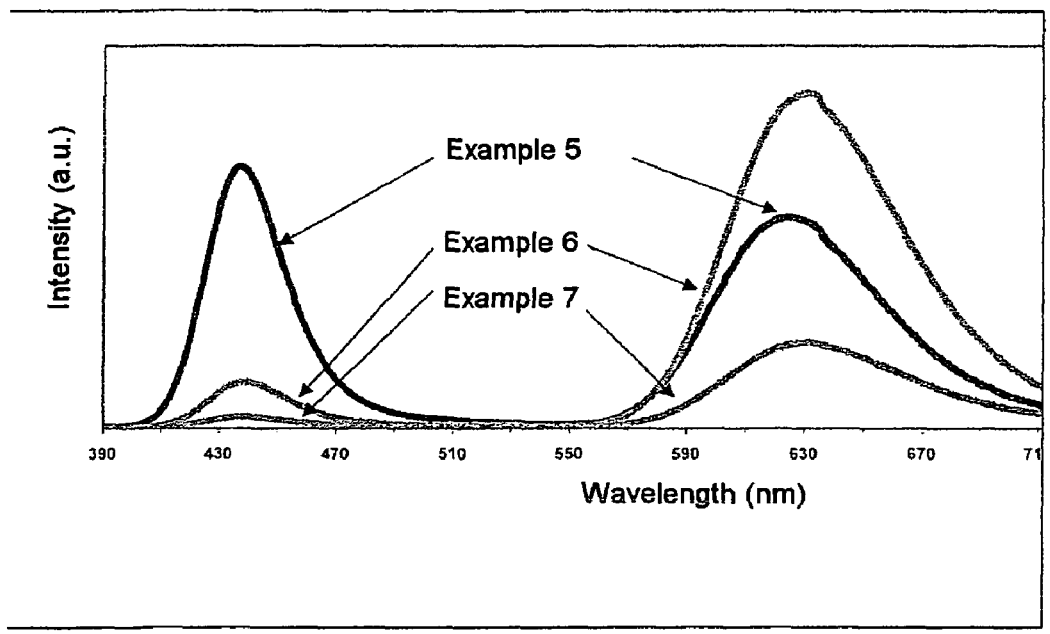
FIG. 4 is a graph showing the emission spectra of three phosphors according to the invention for an excitation wavelength of 370 nm.

The curves shown in FIG. 4 give, for the compounds thus obtained, the emission spectrum for an excitation wavelength of 370 nm. It may be seen that the compound of Example 5 has, in the blue and in the red, substantially similar emission intensities. Emission in the red is, however, maximized for the compound of Example 6.

The invention claimed is:

1. A light-emitting device that emits white light, the device comprising:
    a source of radiation emission in the wavelength range between 370 nm and 420 nm;
    a first phosphor that emits blue light and red light, of formula:

$$Ba_{3(1-x)}Eu_{3x}Mg_{1-y}Mn_ySi_2O_8 \quad (1)$$

wherein: $0<x\leq0.3$ and $0<y\leq0.3$; and
    a second phosphor that emits green light, and wherein in the first phosphor of formula (1), the barium, the magnesium and the silicon are not substituted with an element other than europium and manganese, and wherein the device does not comprise an additional blue phosphor.

2. The device as claimed in claim 1, wherein the second phosphor is:
    a zinc sulfide doped with copper or doped with copper and aluminum;
    an alkaline-earth silicate doped with europium;
    an alkaline-earth aluminate doped with europium;
    a rare-earth borate doped with cerium and terbium;
    a zinc, magnesium or alkaline-earth thiogallate, thioaluminate or thioindate doped with europium and/or manganese;
    an alkaline-earth phosphate or borophosphate doped with europium or doped with europium and terbium;
    a rare-earth silicate doped with europium and terbium;
    an yttrium/nitrogen silicate doped with europium;
    a magnesium/alkaline-earth aluminate doped with europium in combination with cerium and terbium, or in combination with manganese; or
    a magnesium/alkaline-earth chlorosilicate doped with europium, optionally in combination with manganese.

3. The device as claimed in claim 1, wherein the second phosphor is $Ba_2SiO_4$ doped with europium; $SrGa_2S_4$ doped with europium; zinc sulfide doped with copper or doped with copper and aluminum; and $SrAl_2O_4$ doped with europium; or a compound based on at least one element A being an alkaline earth, on at least one element B being aluminum, gallium or indium, on sulfur and on a dopant capable of giving said compound luminescence properties, which second phosphor is in the form of a mixture of a predominant crystallographic phase of the $AB_2S_4$ type and of a crystallographic phase of the $B_2S_3$ type.

4. The device as claimed in claim 1, wherein in formula (1), $0.01\leq x\leq0.25$ and $0.0001\leq y\leq0.25$.

5. The device as claimed in claim 4, wherein in formula (1), $0.01\leq x\leq0.25$ and $0.01\leq y\leq0.25$.

6. The device as claimed in claim 5, wherein in formula (1), $0.01\leq x\leq0.03$ and $0.04\leq y\leq0.06$.

7. The device as claimed in claim 5, wherein in formula (1), $0.01\leq x\leq0.02$ and $0.05\leq y\leq0.01$.

8. The device as claimed in claim 5, wherein in formula (1), $0.09\leq x\leq0.11$ and $0.09\leq y\leq0.11$.

9. The device as claimed in claim 1, wherein in formula (1), x=0.1 and y=0.1.

10. The device as claimed in claim 1, wherein in formula (1), x=0.1 and y=0.2.

* * * * *